US007889882B2

(12) United States Patent
Marshall

(10) Patent No.: US 7,889,882 B2
(45) Date of Patent: Feb. 15, 2011

(54) SELECTABLE DIAPHRAGM CONDENSER MICROPHONE

(76) Inventor: Leonard Marshall, 1910 E. Maple Ave., El Segundo, CA (US) 90245

( * ) Notice: Subject to any disclaimer, the term of this patent is extended or adjusted under 35 U.S.C. 154(b) by 1091 days.

(21) Appl. No.: 11/641,948

(22) Filed: Dec. 20, 2006

(65) Prior Publication Data

US 2008/0152174 A1 Jun. 26, 2008

(51) Int. Cl.

| | |
|---|---|
| ***H04R 9/08*** | (2006.01) |
| *H04R 25/00* | (2006.01) |
| *H04R 3/00* | (2006.01) |
| *H03F 99/00* | (2009.01) |

(52) U.S. Cl. ...................... 381/355; 381/174; 381/313; 381/113; 381/122

(58) Field of Classification Search ................. 381/174, 381/355, 356, 369, 113, 122, 357, 358, 313
See application file for complete search history.

(56) References Cited

U.S. PATENT DOCUMENTS

| | | | | |
|---|---|---|---|---|
| 2,093,664 | A | 9/1937 | Swickard | |
| 2,309,109 | A | 1/1943 | Hathaway | |
| 2,328,941 | A | 9/1943 | Anderson | |
| 3,459,902 | A | 8/1969 | Warning | |
| 4,329,547 | A * | 5/1982 | Imai | 381/163 |
| 4,466,117 | A | 8/1984 | Gorike | |
| 4,862,507 | A | 8/1989 | Woodard | |
| 4,888,807 | A | 12/1989 | Reichel | |
| 2005/0220314 | A1 | 10/2005 | Lang et al. | |

FOREIGN PATENT DOCUMENTS

| | | |
|---|---|---|
| DE | 2339408 | 2/1974 |
| GB | 408221 | 4/1934 |
| GB | 859031 | 1/1961 |
| JP | 1120996 | 5/1989 |
| JP | 8018509 | 1/1996 |

* cited by examiner

*Primary Examiner*—Curtis Kuntz
*Assistant Examiner*—Sunita Joshi
(74) *Attorney, Agent, or Firm*—Welsh Flaxman & Gitler LLC

(57) ABSTRACT

A condenser microphone having a capsule with a cardioid pattern diaphragm on opposite sides of a back plate wherein each diaphragm is selectively activated via a switch to complete the audio circuit. The microphone employs two different diaphragm materials to produce two different sound reproduction characteristics. A first diaphragm produces a "warm and lush" sound output, while the second diaphragm produces a "bright and airy" sound output. The microphone includes the use of a pair of light emitting diodes located behind the grill indicating which capsule diaphragm is activated. The dual diaphragm arrangement is mounted on a standard microphone body and includes conventional electronics for connection to an associated piece of audio equipment producing phantom power.

20 Claims, 4 Drawing Sheets

SELECTABLE DIAPHRAGM CONDENSER MICROPHONE

BACKGROUND OF THE INVENTION

1. Field of the Invention

The present invention relates to sound producing microphones and more particularly to a condenser microphone formed with two different sound producing diaphragms on opposite sides of a back plate, which are operable independently to produce different sound reproduction characteristics.

2. Description of the Prior Art

It is often desired that an audio system produce a wide variety of sounds depending upon the particular material being played, the location of the sound system and/or the mood desired by the listeners. Most often, these types of changes in audio output are generated and regulated by adjustments to the amplifier audio settings of the base and treble circuits, in addition to adjusting the volume control.

In the recording process, the diaphragms of the microphones generate the original sound. Diaphragms of different materials, conductive coatings, thicknesses or stiffnesses have a marked effect on the character of the sound that is ultimately heard by the listener. Recording engineers select a particular microphone to enhance, or make more pleasing to the listener the voice or instrument being recorded.

In a condenser microphone, the capsule includes a diaphragm spaced from a back plate. The diaphragm acts as one plate of a capacitor and the diaphragm vibrates when struck by sound waves, changing the distance between the two plates and therefore changing the capacitance. Specifically, when the plates are closer together, capacitance increases and a charge current occurs. When the plates are further apart, capacitance decreases and a discharge current occurs. A voltage is required across the capacitor for this to work. This voltage is supplied either by a battery in the microphone or by external phantom power source from the equipment to which the microphone is connected.

Since the plates are biased with a fixed charge (Ø), the voltage maintained across the capacitor plates changes with the vibrations in the air, according to the capacitance equation: Q=C×V where Q=charge in coulombs, C=capacitance in farads and V=potential difference in volts. The capacitance of the plates is inversely proportional to the distance between them for a parallel-plate capacitor.

Condenser microphones produce high quality audio signals and are a popular choice in laboratory and studio recordings and range in cost from inexpensive to very expensive. Condenser microphones are available with two capsules wherein the signals from each are electrically connected to provide a range of polar patterns. Polar patterns are a graphical representation of the microphone's directionality.

Every microphone has a property known as directionality. This describes the microphone's sensitivity to sound from various directions. Some microphones pick up sound equally from all directions, while others pick up sound only from one direction or a particular combination of directions. The types of directionality are divided into three main categories:

1) Omnidirectional, which picks up sound evenly from all directions.

2) Unidirectional, which picks up sound predominantly from one direction and includes cardioid, i.e., heart shaped patterns.

3) Bidirectional, which picks up sound from two opposite directions.

In other words, the term polar pattern is used to describe the response of a microphone to sound sources from various directions. Each type of polar pattern has its own place and usage in the recording process. Generally, microphones tend to become more directional in focus as frequencies increase. In other words, diaphragms are generally less sensitive to high frequencies off axis. The cardioid is the most common polar pattern found in microphones. Cardioids pick up sound primarily from the front of the diaphragm. The back of the diaphragm rejects sound, allowing the engineer to isolate the signal source from other performance elements or background noise. Omni is used to capture room ambience and reflections along with the source, thereby yielding a more open sound compared to the more focused quality of cardioid. Omni is desirable for vocal groups, Foley sound effects, and realistic acoustic instruments. Omni also exhibits significantly less proximity effect than cardioids.

In multi-pattern microphones, plural diaphragms may be used, of the same or different materials, however, all diaphragms are polarized and operate at the same time to create the multi-pattern.

With the foregoing in mind, a need exists for an improved condenser microphone providing the user with the added versatility of two different sounding cardiod pattern microphones in one. The present invention provides such a microphone.

SUMMARY OF THE INVENTION

The present invention is a condenser microphone having a capsule with a cardioid pattern diaphragm on opposite sides of a back plate wherein each diaphragm is selectively activated via a switch to complete the audio circuit. The microphone employs two different diaphragm materials to produce two different sound reproduction characteristics. A first diaphragm produces a "warm and lush" sound output, while the second diaphragm produces a "bright and airy" sound output. The user selects the particular diaphragm via a switch mounted on the microphone body such that the polarizing voltage running through the back plate is active on only the diaphragm selected. The microphone includes the use of a pair of light emitting diodes located behind the grill indicating which capsule diaphragm is activated. The dual diaphragm arrangement is mounted on a standard microphone body and includes conventional electronics for connection to an associated piece of audio equipment producing phantom power.

It is an object of the invention to provide a back plate formed of two pieces screwed together in a back-to-back configuration or formed of one integral piece with diaphragms on both sides wherein the back plate is polarized during operation.

Another object is the provision of a microphone wherein one diaphragm is formed from a thicker material than the other diaphragm.

Still another object is to provide a microphone wherein the indicator lights are LEDs located behind the grill and reflect upon the diaphragms.

Still further it is an object to locate the LEDs in close proximity to a respective diaphragm in order to provide heat thereto and aid in controlling moisture on the diaphragm.

Still another object is the provision of a microphone having different sounding outputs controlled by a switch mounted on the microphone body to activate one diaphragm or the other independently.

Another object is the provision of a microphone capable of providing a visual indication of the type of sound output produced by the microphone and which diaphragm of the microphone is activated, thus indicating to the user which side of the microphone to orate into.

Other objects and advantages of the present invention will become apparent from the following detailed description when viewed in conjunction with the accompanying drawings, which set forth certain embodiments of the invention.

DESCRIPTION OF THE PREFERRED EMBODIMENTS

Figure 1:
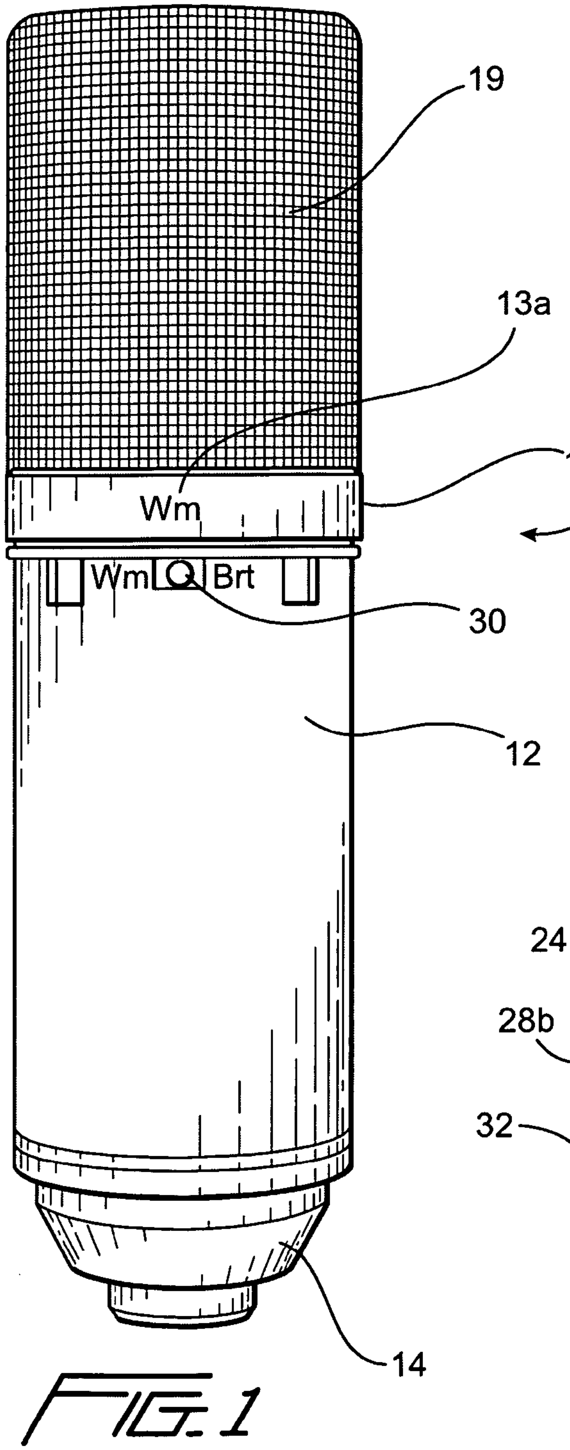
FIG. 1 is a front perspective view of the "warm" side of a microphone in accordance with the present invention.
Figure 5:
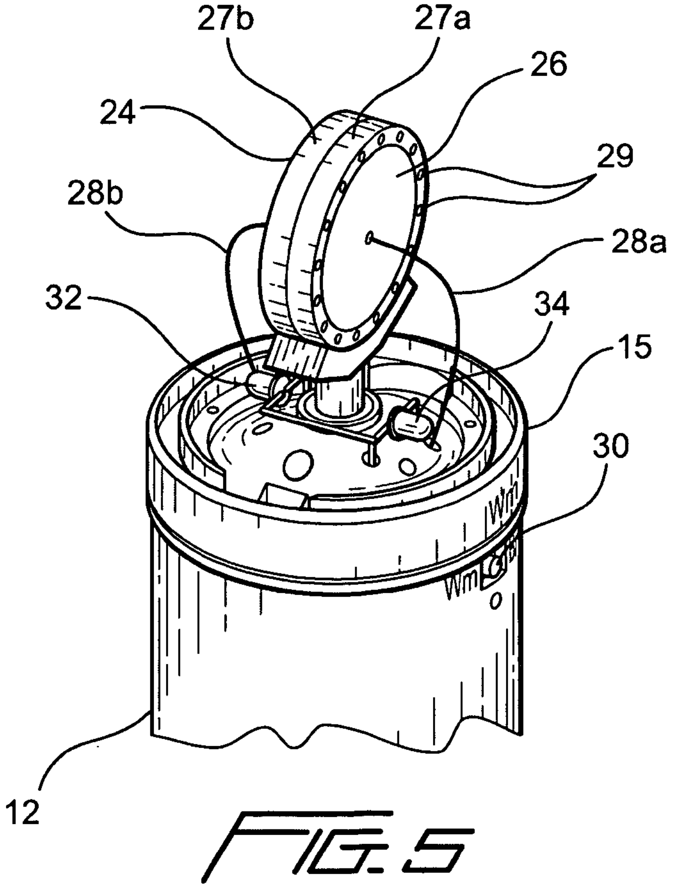
FIG. 5 is a top perspective view with the grill removed.
Figure 2:
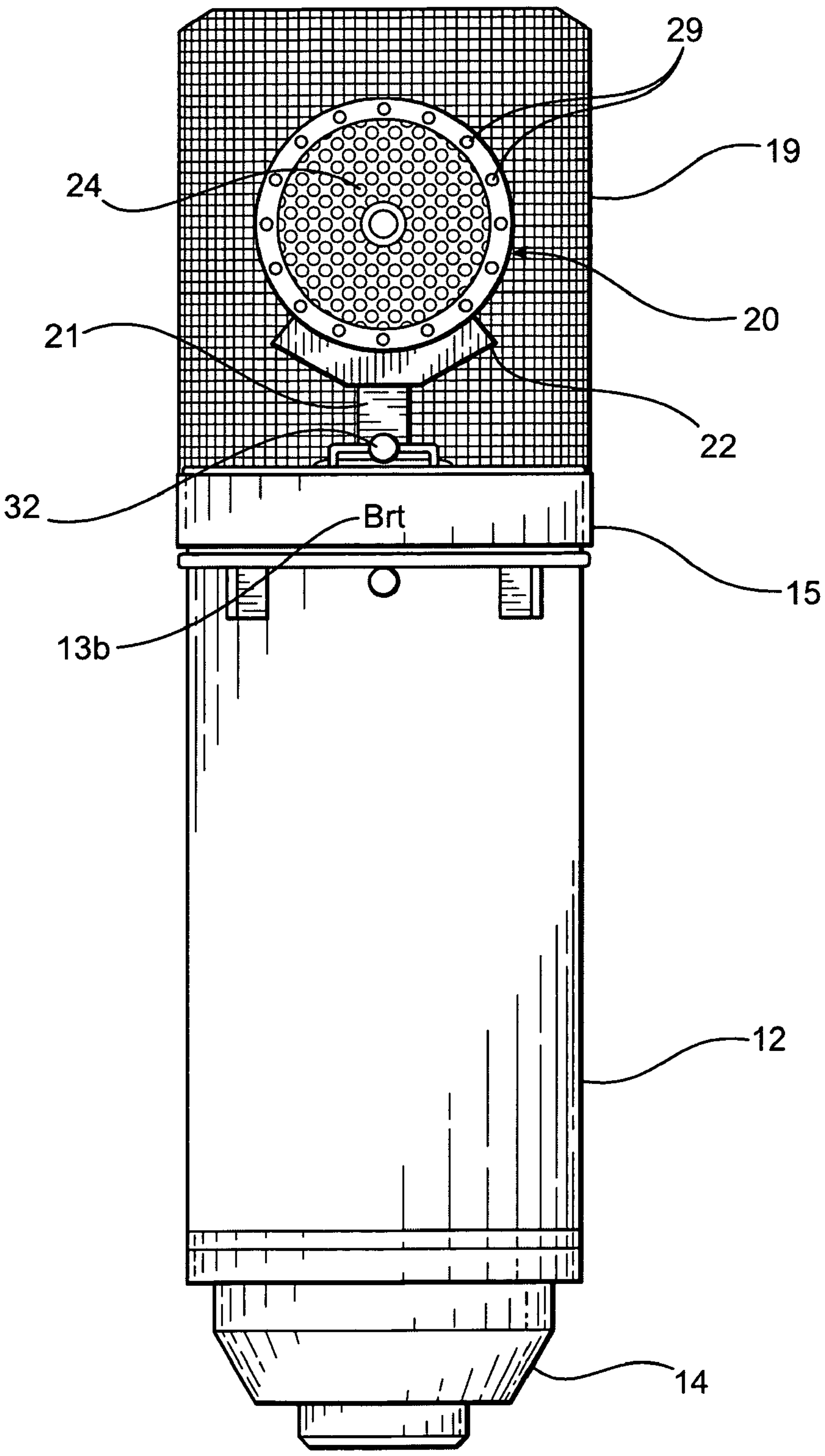
FIG. 2 is a rear view of FIG. 1 showing the "bright" side of the microphone in accordance with the present invention.
Figure 3:
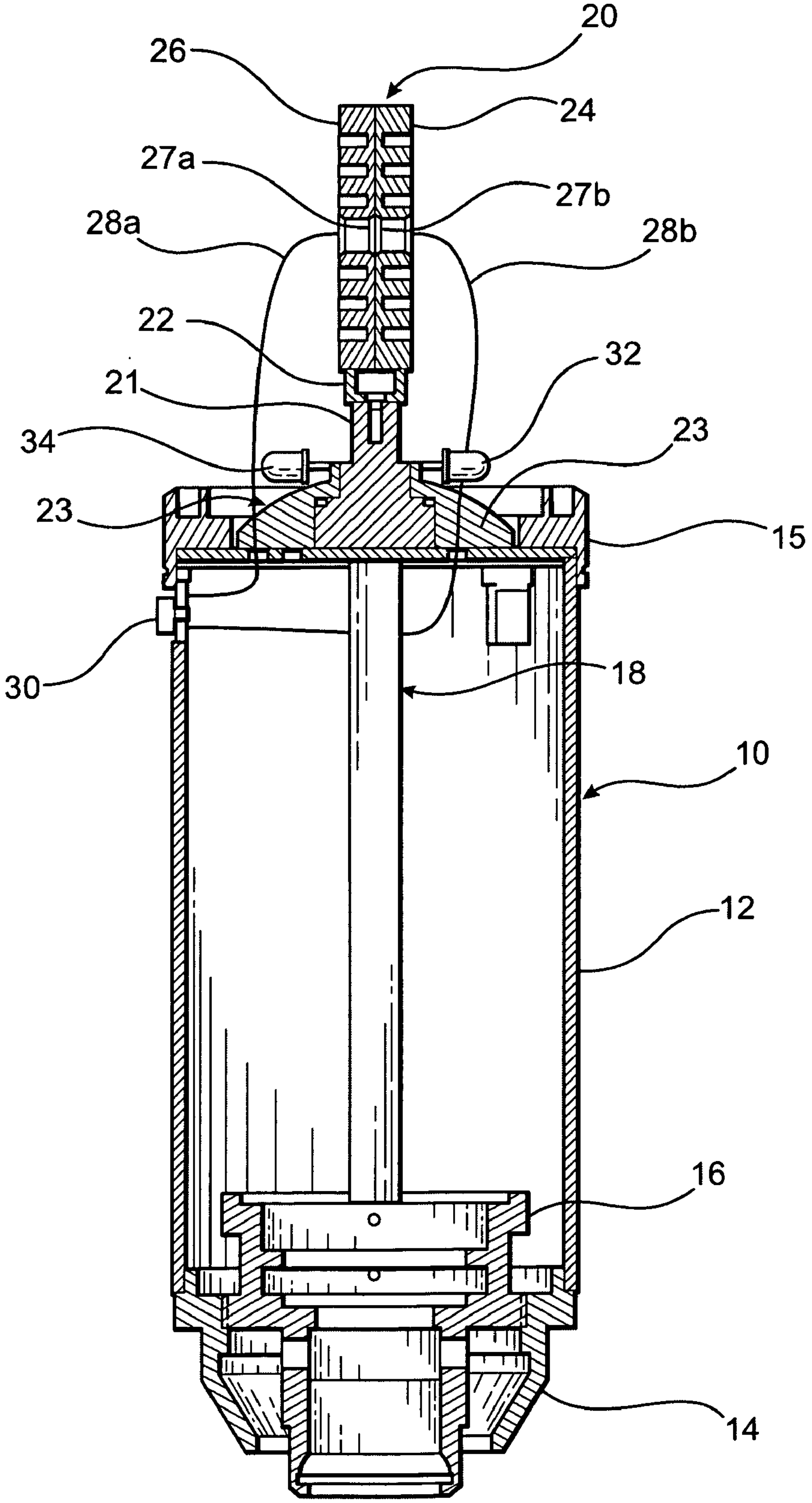
FIG. 3 is a sectional view of FIG. 2 with the microphone rotated 90 degrees.

The detailed embodiment of the present invention is disclosed herein. It should be understood, however, that the disclosed embodiment is merely exemplary of the invention, which may be embodied in various forms. Therefore, the details disclosed herein are not to be interpreted as limiting, but merely as the basis for the claims and as a basis for teaching one skilled in the art how to make and/or use the invention.

Referring to the drawings, a condenser microphone 10 includes a cylindrical body 12 having a bottom ring 14 and a top closure 15 secured thereto. The body 12 can be made of various plastics, however, metal is the preferred material. A female XLR cable connector 16 is mounted in the bottom ring 14 for attachment to a male XLR cable connector at the end of a cable (not shown) going to an amplifier, power source or other audio equipment used to reproduce the sound. That is, the cable functions to connect the microphone 10 to an input on an electronic sound system piece of equipment, such as a mixer, tape player, etc. A frame 18 connects the bottom ring 14 and top closure 15, and holds a printed circuit board PCB (not shown). The PCB includes a circuit that connects to the capsule assembly 20 on one side and the XLR output connector 16 on the other side. The circuit functions to amplify or convert the voltage from the high impedance capsule signal to a lower impedance signal used in or compatible with professional audio applications. The circuit board could also be put under or on top of the top closure 15 in a smaller version of the same microphone. A suitable grill 19 cooperates with top closure 15 and covers the top of the microphone 10. The top closure 15 includes indicia areas 13*a*, 13*b* thereon to indicate which side of the capsule assembly 20 is to be used for a warm sound output and which is to be used for a bright sound output. Thus, the user will know which side of the microphone 10 to face depending on the sound quality desired when operating.

The capsule assembly 20 is mounted to the body 12 with a suitable bracket 22 and support post 21 extending from the top closure 15. A rubber isolation grommet 23 acoustically isolates the capsule assembly 20 from the metal parts of the microphone 10.

The capsule assembly 20 includes an integral back plate 27 or a pair of back plate sides 27*a*, 27*b* screwed together in a back-to-back relation to form a common back plate, a first cardioid pattern diaphragm 24 and a second cardioid pattern diaphragm 26 mounted on opposite sides of the back plate 27. The capsule components are secured together via screws 29 to form the capsule assembly 20. The back plate 27 is generally made from a metal such as brass and is about 0.5 inches thick when side 27*a* is screwed to side 27*a*. The first and second diaphragms 24, 26 are made from materials having different reflective properties. The second diaphragm 26 on one side of the capsule assembly 20 is designed from a thin material to provide a lush warm or bassy sound, whereas the first diaphragm 24 is designed from a thicker material to provide a bright and airy sound. Since thick materials do not move as easily as thin materials when subjected to acoustic waves they produce different sounds. Thicker materials have a brighter sound because the low frequencies roll off sooner than they do on a thinner material while high frequencies show a rising response at a certain point in the upper midrange. The preferred diaphragm material is mylar.

In audio applications diaphragm materials between 2-30 microns can be used, but professional condenser microphones subjectively sound best between 3-10 microns.

The chart below shows differences in three different mylar diaphragm materials:

| | 50 Hz | 100 Hz | 1 Khz | 3.5 kHz | 15 kHz |
|---|---|---|---|---|---|
| 6 micron | −1 dB | 0 dB | 0 dB | +3 dB | +3 dB |
| 8 micron | −2 dB | −1 dB | 0 dB | +1 dB | +1.5 dB |
| 12 micron | −4 dB | −2 dB | 0 dB | +2 dB | +1 dB |

Diaphragm materials usually are polyester, mylar or thin metal sheets like titanium. The plastic diaphragms are coated with a low resistance conductive coating such as gold, nickel or similar materials well known in the art. Any combination of plating and thickness of the plastic or metal materials will change the characteristics of the diaphragm reaction to the incoming acoustical sound waves. Even small differences in the diaphragm structure or properties can be heard on good studio or home audio equipment.

The net effect of the two different diaphragm materials mounted on opposite sides of a back plate 27 is that you get two microphones with different sound reproduction characteristics in a single unit which operate independently. Further, while being mounted in a back-to-back configuration the diaphragms do not interfere with each other when one is active and the other is not. This is a result of the sound being produced on only one side of the polarized back plate 27 at a time. Since the switch 30 only connects one diaphragm at a time to the preamplifier no sound is produced on the opposite side of back plate 27. That is, back plate 27 is always polarized through the voltage running through the DC converter 52 and one diaphragm at a time is connected via switch 30 to preamplifier 31. Preamplifier 31 is internal to the microphone and amplifies the received acoustic signal and sends the signal out to a microphone input, shown as pins 1, 2, 3 in FIG. 4 on a piece of audio equipment 55 from which the voltage converter 52 receives its phantom power. The other diaphragm has no connection to the preamplifier 31 at this point. Therefore, it strictly acts as the back of the capsule and does not interfere with the front, thereby not affecting the cardioid pattern of the other diaphragm.

The back plate 27 is connected to a resistor R6 at one end and a capacitor C4 which runs to ground G at its other end. R6 is connected to the voltage converter 52 that increases the voltage from the phantom power supply to that required by the microphone 10. The voltage converter 52 draws very little current so it does not affect the voltages needed to run the other part of the circuit. The capsule itself does not draw any current so it does not load down the output of the voltage converter 52. As previously stated, the phantom power is obtained from the audio equipment to which microphone 10 is connected via a XLR cable connection.

Figure 4:
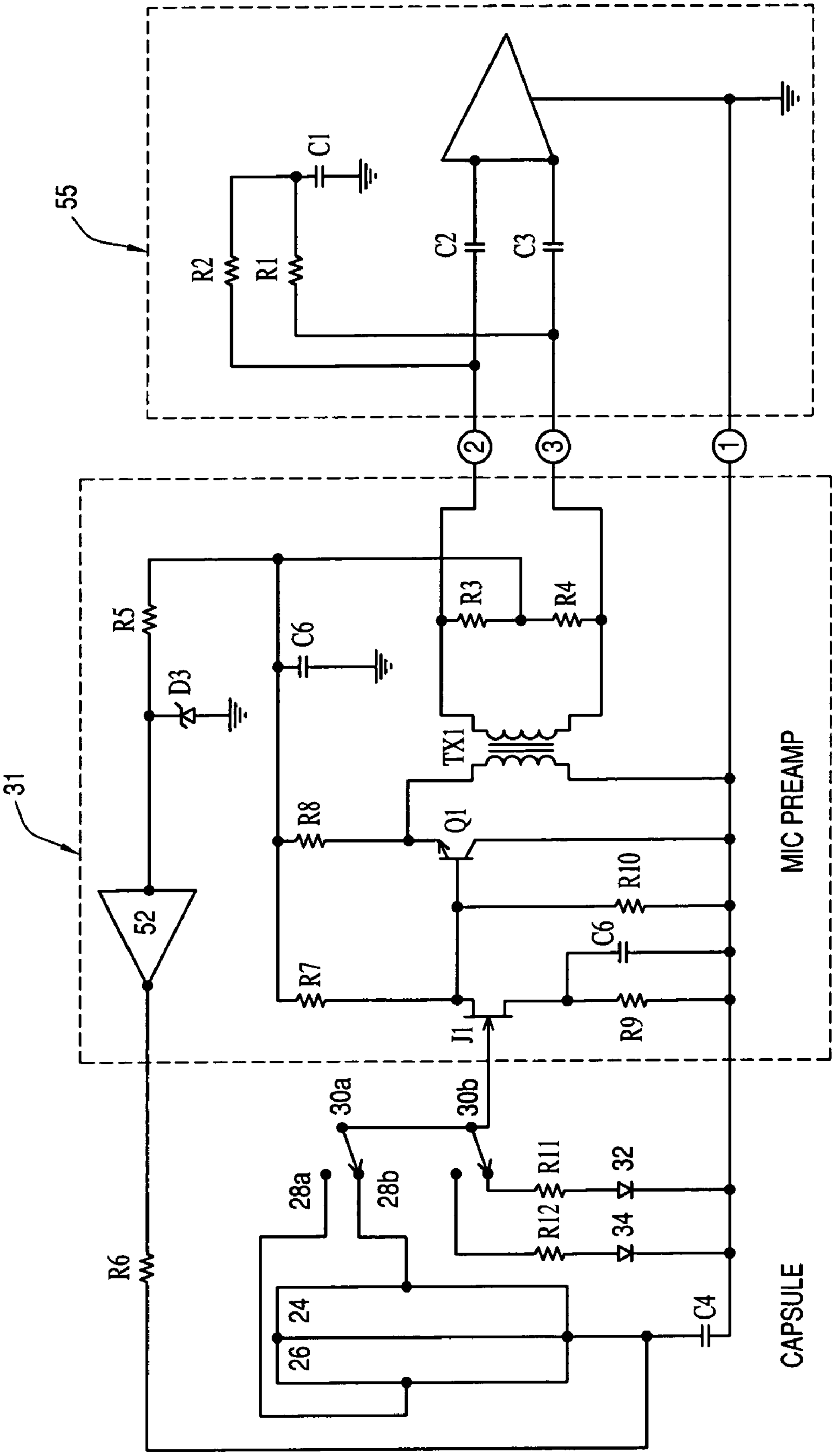
FIG. 4 is a schematic drawing of the switching circuit of the microphone.

Powering a microphone via phantom power is well known in the art and the circuit diagram in FIG. 4 is just one example of how a condenser microphone obtains its power, as such those skilled in the art would appreciate that a variety of circuits could be used. U.S. Pat. No. 4,757,545, which is incorporated herein by reference, shows yet another phantom power supply for a condenser microphone.

Leads 28*a*, 28*b* are connected to a double pole, double throw switch 30 that is used to activate either the first diaphragm 24 or the second diaphragm 26 in accordance with the selected switch position, such that when lead 28*a* is activated, the second diaphragm 26 will be operative and send signals to preamplifier 31, and when lead 28*b* is activated the first diaphragm 24 will be operative and send signals to preamplifier 31. When the first diaphragm 24 is activated by switch 30 to complete the circuit a user can then hold the "Brt" side near his/her mouth during use and the opposite occurs when the second diaphragm 26 is activated. Thus, only one side of the microphone 10 is used at a time. The circuit diagram in FIG. 4 illustrates the double pole, double throw switch 30 connected between the diaphragms 24 and 26 and a preamplifier 31, located on the circuit board to perform amplifying of the audio signal received from the activated diaphragm.

A pair of resistors R11, R12 and light emitting diodes (LEDs) 32, 34 are mounted on opposite sides of the dual diaphragm capsule assembly 20. The resistors function to prevent the LEDs from receiving too much current. The LEDs are electrically connected through the double pole, double throw switch 30, wherein one side of the switch 30*a* controls which diaphragm goes to the preamplifier 31 and the other side of the switch 30*b* controls which LED is energized. The first diaphragm 24 and LED 34 are connected on opposite sides of the isolated switch 30 so they do not interfere with each other. When a diaphragm 24, 26 is activated by the switch 30, the associated LED 32, 34, respectively, is also activated by switch 30 and will be lit, providing a visual indication of which diaphragm 24, 26 is switched to an operational mode. Each LED is positioned behind the grill 19 and shines light on reflecting surfaces of the diaphragms 24, 26, providing a glowing effect behind the grill 19, particularly in low ambient light conditions. Also, because of the position of each LED 32, 34 behind the grill 19, and in proximity to the diaphragms 24, 26, heat is generated which helps prevent moisture from accumulating on the diaphragm assembly 20. Moisture is known to cause unwanted noise. Lastly, the LED when lit indicates what side of the microphone the user should orate into.

While the preferred embodiments have been shown and described, it will be understood that there is no intent to limit the invention by such disclosure, but rather, is intended to cover all modifications and alternate constructions falling within the spirit and scope of the invention as defined in the appended claims.

The invention claimed is:

1. A condenser microphone providing different sound reproduction characteristics, comprising:

a body;

a capsule assembly extending from said body including a back plate with a first side and a second opposite side with a cardioid pattern diaphragm on each side thereof, wherein the diaphragm on the first side is made from a material having different reflective properties than the diaphragm on the second side; and a switch mounted to the body to selectively activate one of said diaphragms independent of the other to produce a microphone with two different sound reproduction characteristics.

2. The microphone of claim 1, wherein back plate is formed of two pieces screwed together in a back-to-back configuration.

3. The microphone of claim 1, wherein back plate is formed of one integral piece.

4. The microphone of claim 1, further including at least one indicator light providing visual indication of which diaphragm is activated.

5. The microphone of claim 4, wherein the at least one indicator light is a plurality of light emitting diodes with one of each of said light emitting diodes being associated with a single diaphragm.

6. The microphone of claim 1, further including a grill connected to the body for covering the capsule assembly.

7. The microphone of claim 1, wherein one diaphragm is thicker than the other.

8. The microphone of claim 4, wherein the at least one indicator light is located behind the grill and reflects upon the diaphragm.

9. The microphone of claim 4, wherein the at least one indicator light is located in proximity to one of said diaphragms and provides heat to aid in controlling moisture on the diaphragm.

10. The microphone of claim 1, wherein the back plate is polarized during operation.

11. A condenser microphone providing different sound reproduction characteristics, comprising:

a body;

a capsule assembly extending from said body wherein the capsule includes a back plate with a first side spaced from a first cardioid pattern diaphragm and a second side spaced from a second cardioid pattern diaphragm of a different thickness than the first diaphragm; and a switch mounted to the body to selectively activate one of said diaphragms independent of the others to produce a microphone with two different sound reproduction characteristics.

12. The microphone of claim 11, wherein back plate is formed of two pieces screwed together in a back-to-back configuration.

13. The microphone of claim 11, wherein back plate is formed of one integral piece.

14. The microphone of claim 11, further including at least one indicator light providing visual indication of which diaphragm is activated.

15. The microphone of claim 14, wherein the at least one indicator light is a plurality of light emitting diodes with one of each of said light emitting diodes being associated with a single diaphragm.

16. The microphone of claim 11, further including a grill connected to the body for covering the capsule assembly.

17. The microphone of claim 14, wherein the at least one indicator light is located behind the grill and reflects upon the diaphragm.

18. The microphone of claim 14, wherein the at least one indicator light is located in proximity to one of said diaphragms and provides heat to aid in controlling moisture on the diaphragm.

19. The microphone of claim 1, wherein the back plate is polarized during operation.

20. The microphone of claim 1, wherein the diaphragms are formed from different thickness of mylar.

* * * * *